(12) United States Patent
Pendyala et al.

(10) Patent No.: US 7,869,981 B2
(45) Date of Patent: Jan. 11, 2011

(54) AUTOMATED METHOD AND SYSTEM FOR OBJECT CONFIGURATION

(75) Inventors: Chandra Pendyala, Franklin, TN (US); Robert Broadhead, Franklin, TN (US); Rajan Rajbhandari, Brentwood, TN (US); Roy Riggs, Franklin, TN (US)

(73) Assignee: Edgenet, Inc., Brentwood, TN (US)

( * ) Notice: Subject to any disclaimer, the term of this patent is extended or adjusted under 35 U.S.C. 154(b) by 615 days.

(21) Appl. No.: 10/991,471

(22) Filed: Nov. 19, 2004

(65) Prior Publication Data

US 2006/0111878 A1 May 25, 2006

(51) Int. Cl.
*G06F 17/50* (2006.01)
*G09B 25/00* (2006.01)

(52) U.S. Cl. .................. 703/1; 434/79; 434/80
(58) Field of Classification Search ........... 703/1; 434/79, 80; 705/29; 700/103, 104, 106, 700/107; 345/619
See application file for complete search history.

(56) References Cited

U.S. PATENT DOCUMENTS

| | | | |
|---|---|---|---|
| 5,467,444 A | 11/1995 | Kawamura et al. | |
| 5,724,261 A * | 3/1998 | Denny et al. | 702/184 |
| 6,002,853 A | 12/1999 | de hond | |
| 6,016,147 A | 1/2000 | Gantt | |
| 6,249,714 B1 | 6/2001 | Hocaoglu et al. | |
| 6,683,606 B1 | 1/2004 | Yamamoto et al. | |
| 6,727,925 B1 | 4/2004 | Bourdelais | |
| 6,810,401 B1 * | 10/2004 | Thompson et al. | 707/101 |
| 6,865,524 B1 | 3/2005 | Shah et al. | |
| 7,167,876 B2 * | 1/2007 | Cookson et al. | 707/200 |
| 7,308,418 B2 * | 12/2007 | Malek et al. | 705/10 |
| 2001/0047251 A1 * | 11/2001 | Kemp | 703/1 |
| 2002/0010522 A1 * | 1/2002 | Martin | 700/97 |
| 2005/0144090 A1 * | 6/2005 | Gadamsetty et al. | 705/26 |

\* cited by examiner

*Primary Examiner*—Paul L Rodriguez
*Assistant Examiner*—Andre Pierre Louis
(74) *Attorney, Agent, or Firm*—Joseph T. Leone, Esq.; Daniel A. Blasiole; DeWitt Ross & Stevens S.C.

(57) ABSTRACT

An automated system and method is provided for configuring an object (e.g., a room). In accordance with a preferred embodiment, configuration is facilitated through the use of layering functionality and frame-based inferences to evaluate stored knowledge of object attributes. The frame-based inferences may be supplemented by a rules-based inference system. In accordance with a preferred embodiment of the invention, a graphics-based user interface may be used to permit interactive configuration using two-dimensional and three-dimensional models of the object, and incorporating engineering specifications, as well as functional and physical attributes.

13 Claims, 15 Drawing Sheets

AUTOMATED METHOD AND SYSTEM FOR OBJECT CONFIGURATION

BACKGROUND

Designing a room requires numerous decisions to be made. For each decision there may be many different choices. Such choices may include room style (e.g., contemporary, classic, etc.), room size, room layout, room color, price range, etc. Additional choices may include the types or brands of products to be placed in a room (e.g., sink, range, etc.), along with product size, color, material, price range, etc. The choices can be based on many factors including consumer preferences, engineering constraints, space constraints, industry standards, and design or aesthetic considerations. Each decision made may constrain or otherwise influence other decisions.

A "constraint" is broadly understood as a condition upon which certain options may be selected. The set of options that could be selected may be narrower after a given choice is made. On the other hand, it is possible that the set of options could be broader once a given choice is made. For example, if a four-foot cabinet is selected, the range of options may be broader than if a five-foot cabinet is selected.

For example, with an "L-shaped" kitchen, a layout with the sink in one leg of the "L" presents certain constraints: it may be desirable to have a dishwasher next to the sink; or, a dishwasher and/or sink may only be located adjacent to appropriate room-specific plumbing. Other examples may include: a selection of a relatively small kitchen, prevents the use of a relatively large table; or selection of a kitchen in a contemporary style precludes the selection of a sink in the "classic" style.

SUMMARY

An automated system and method is provided for configuring an object (e.g., a room). In accordance with a preferred embodiment, configuration is facilitated through the use of layering functionality and frame-based inferences to evaluate stored knowledge of object attributes. The frame-based inferences may be supplemented by a rules-based inference system. In accordance with a preferred embodiment of the invention, a graphics-based user interface may be used to permit interactive configuration using two-dimensional and three-dimensional models of the object, and incorporating engineering specifications, as well as functional and physical attributes.

DETAILED DESCRIPTION

Preferred embodiments and applications of the invention will be described herein. Other embodiments may be realized and structural or logical changes may be made to the embodiments without departing from the spirit or scope of the invention. Although the preferred embodiments disclosed herein have been particularly described as applied to configuration (e.g., a visual configuration) of an object such as a room, it should be readily apparent that the invention may be embodied to provide configuration functionality for any number of applications, services or the like where configured and/or customized products or services are browsed, selected, purchased, sold, supported or otherwise considered.

In accordance with a preferred embodiment of the invention, an object configuration method and system is embodied in a single (or multiple) processor-based system that may be supported in a stand-alone, networked, mainframe, or client-server architecture. A single (or multiple) program memory module is provided for storing one or more computer programs used to perform the functionality described herein.

In accordance with a preferred embodiment, one or more user interfaces are provided as part of (or in conjunction with) the object configuration system of the invention to permit users to interact with the system. Individual ones of a plurality of client devices (e.g., network/stand-alone computers, personal digital assistants (PDAs), WebTV (or other Internet-only) terminals, set-top boxes, cellular/PCS phones, screen-phones, pagers, kiosks, or other known (wired or wireless) communication devices, etc.) may similarly be used to execute one or more computer programs (e.g., universal Internet browser programs, dedicated interface programs, etc.) to allow users to interface with the configuration system.

Figure 1:
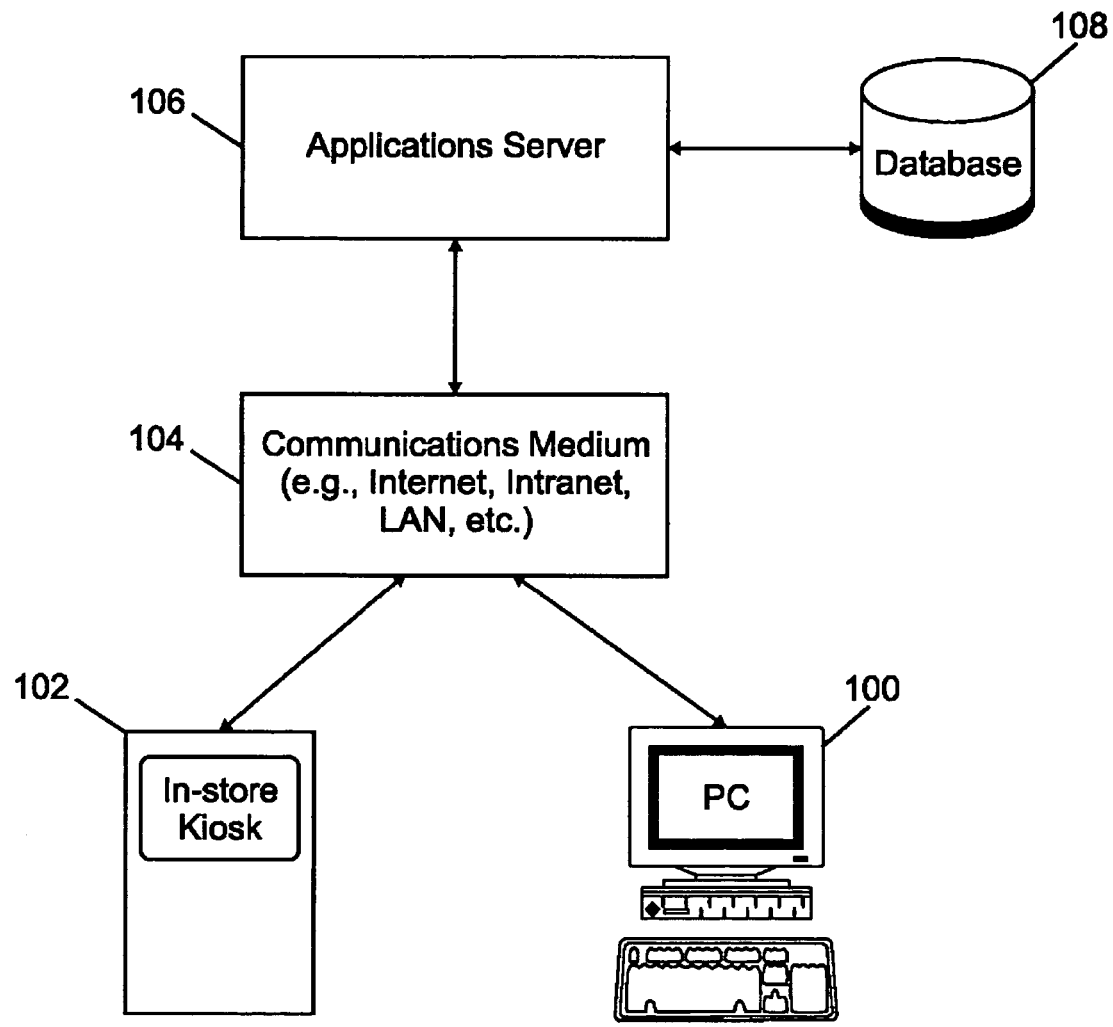
FIG. 1 shows an example of a network arrangement in accordance with a preferred embodiment of the invention.

In accordance with a preferred embodiment of the invention, a system in the form of a network arrangement is provided, as shown, for example, in FIG. 1. As will be easily appreciated by one of skill in the art, the arrangement can be modified to suit individual circumstances. In this preferred embodiment, the system may be used to perform configuration of an object such as a room. A user interface may be provided in the form of a personal computer (PC) 100, which may be located, for example, at a user's home, or in the form of an in-store computer or other processing device such as kiosk 102 (or other mechanism in the store). In this exemplary embodiment, the store may be a retailer that serves as the retail outlet (e.g., sale, delivery, installation, etc.) for many or all of the components used in the configured room. (It should be understood that the term "component" comprises not only individual products but a component can be a floor, wall, or any other aspect of a room used in room design.)

A communications medium 104, which may take any form (integrated, distributed, wired, wireless, etc.) such as the Internet, an intranet, a local area network (LAN), etc., may be provided to provide connectivity between a user interface and one or more programmed computers (as symbolically represented by applications server 106 and database 108) that execute the configuration functionality in accordance with preferred embodiments of the invention. (It will be appreciated that the configuration functionality as described herein may be located (in whole or in part) in any other portion of the network (e.g., on PC 100, kiosk 102, etc.) in accordance with preferred embodiments of the invention.) Further, the server 106 is in communication with database 108 in which room configuration information is stored. Database 108 may be physically or logically associated with server 106.

In accordance with a preferred embodiment, a user (e.g., consumer, sales-representative, buyer, seller, contractor, builder, architect, consultant, organizer, project coordinator, etc.) interacts with the system to configure an object such as a room. The interactive nature of the system aids the user in arriving at the desired configuration including production of any corresponding information (e.g., layouts, pricing, schematics, product specifications, manufacturing requirements, parametric drawings, etc.).

Figure 2:
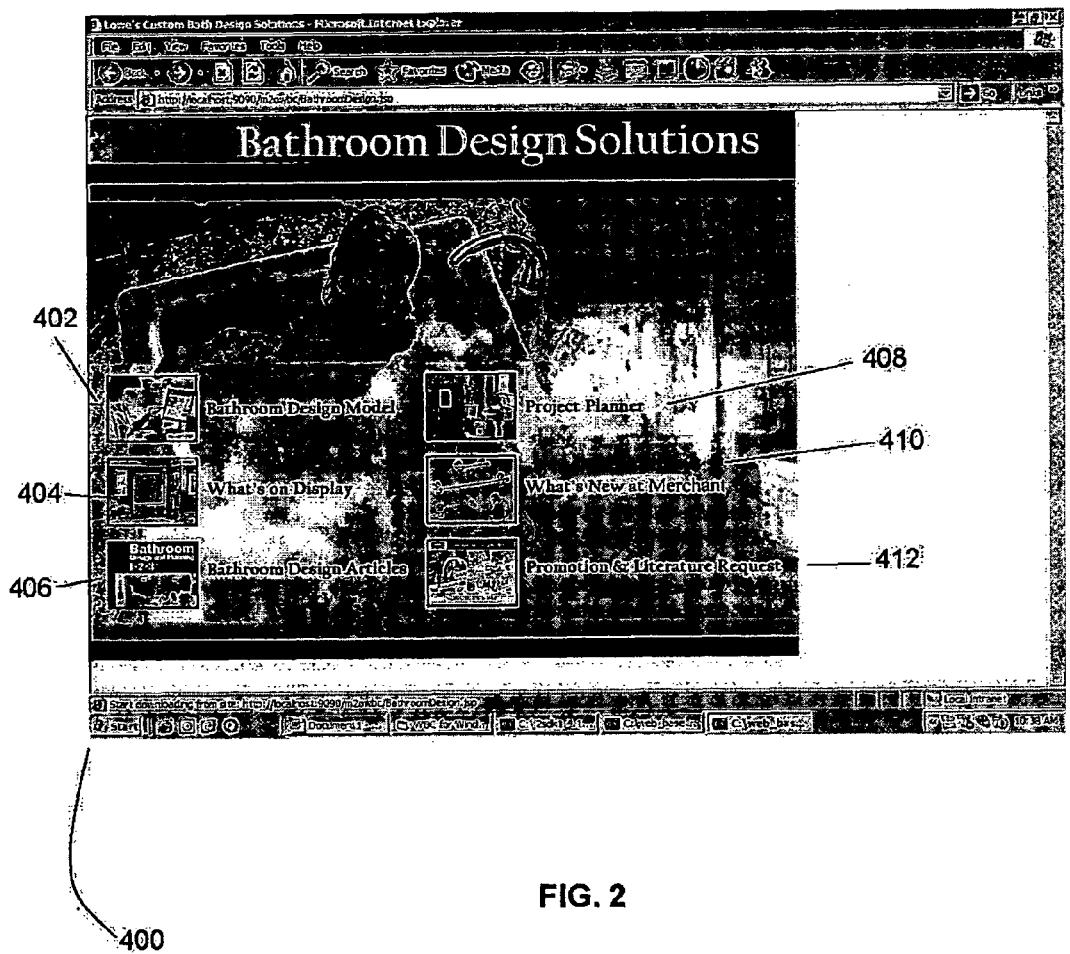
FIGS. 2-5 depict exemplary screen shots of a commercial implementation of a preferred embodiment of the invention.

FIGS. 2-5 depict an exemplary commercial implementation of a preferred embodiment of the invention. FIG. 2 particularly depicts a screen shot 400 accessible by a user through a user interface (e.g., PC 100, in-store kiosk 102, etc.). In configuring an object in the form of a room, in this implementation, the user is presented with several options. Those options include a "Bathroom Design Model" option 402, a "What's on Display" option 404, a "Bathroom Design Articles" option 406, a "Project Planner option 408, a "What's New at Merchant" option 410 and a Promotion and Literature Request" option 412.

Figure 3:
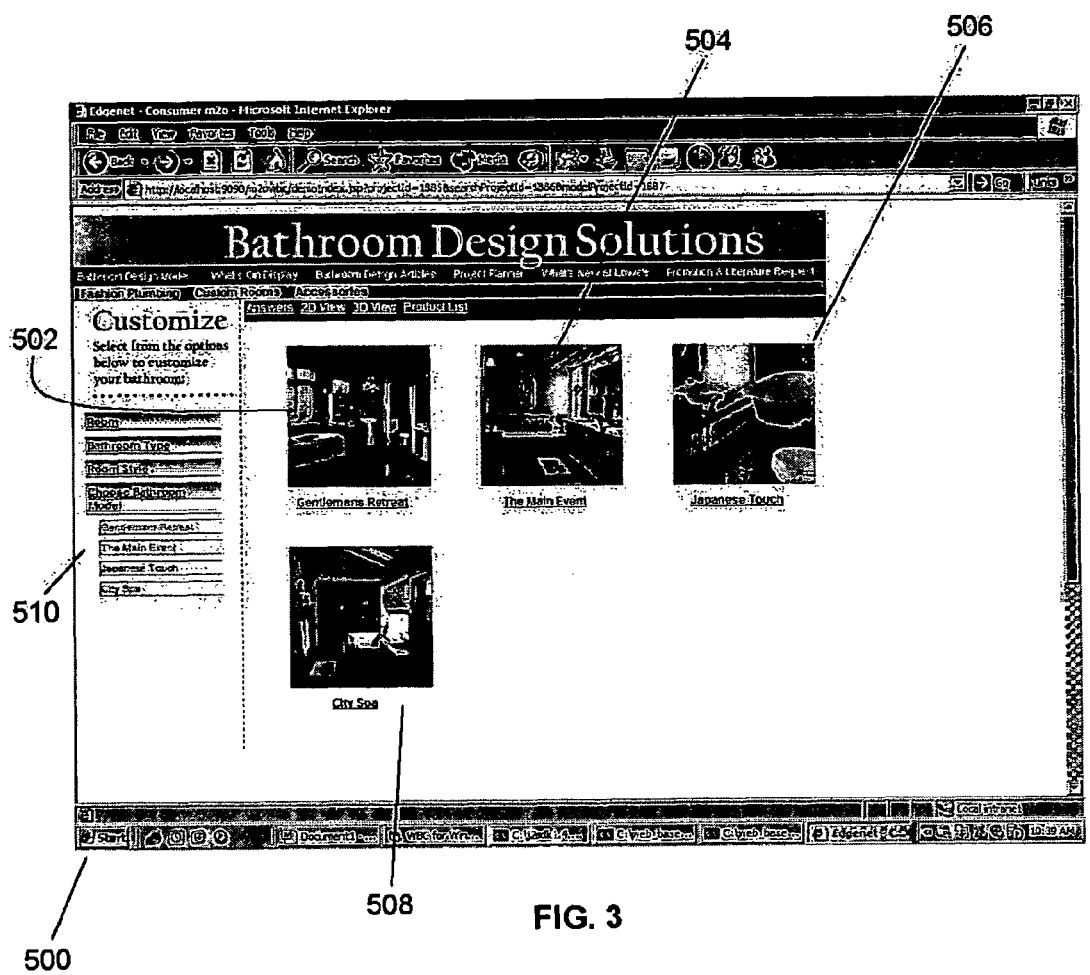

User selection of the "Bathroom Design Model" 402 option causes the system to present a variety of different model bathrooms each having different styles or other consumer applications, as illustrated in screen shot 500 (FIG. 3). Each of the different styles of the bathrooms may be pre-configured (e.g., by the retailer) with different styles and arrangements of appliances, fixtures, or other components (e.g., tubs, sinks, floor, wall paper, paint colors, windows, doors, etc.) to match the style of the room design. For example, the bathroom style titled "Gentleman's Retreat" 502 is pre-configured with a plurality of components, colors and textures fitting a traditional style bathroom having masculine features. In comparison, the bathroom style titled "City Spa" 508 is pre-configured with an arrangement of components different from those of the Gentleman's Retreat 502 and which are relatively more contemporary in style. The information defining the components of each of these exemplary bathroom styles and other related data are preferably stored in one or more storage units accessible by the system, as symbolically represented by database 108 (FIG. 1).

Figure 4:
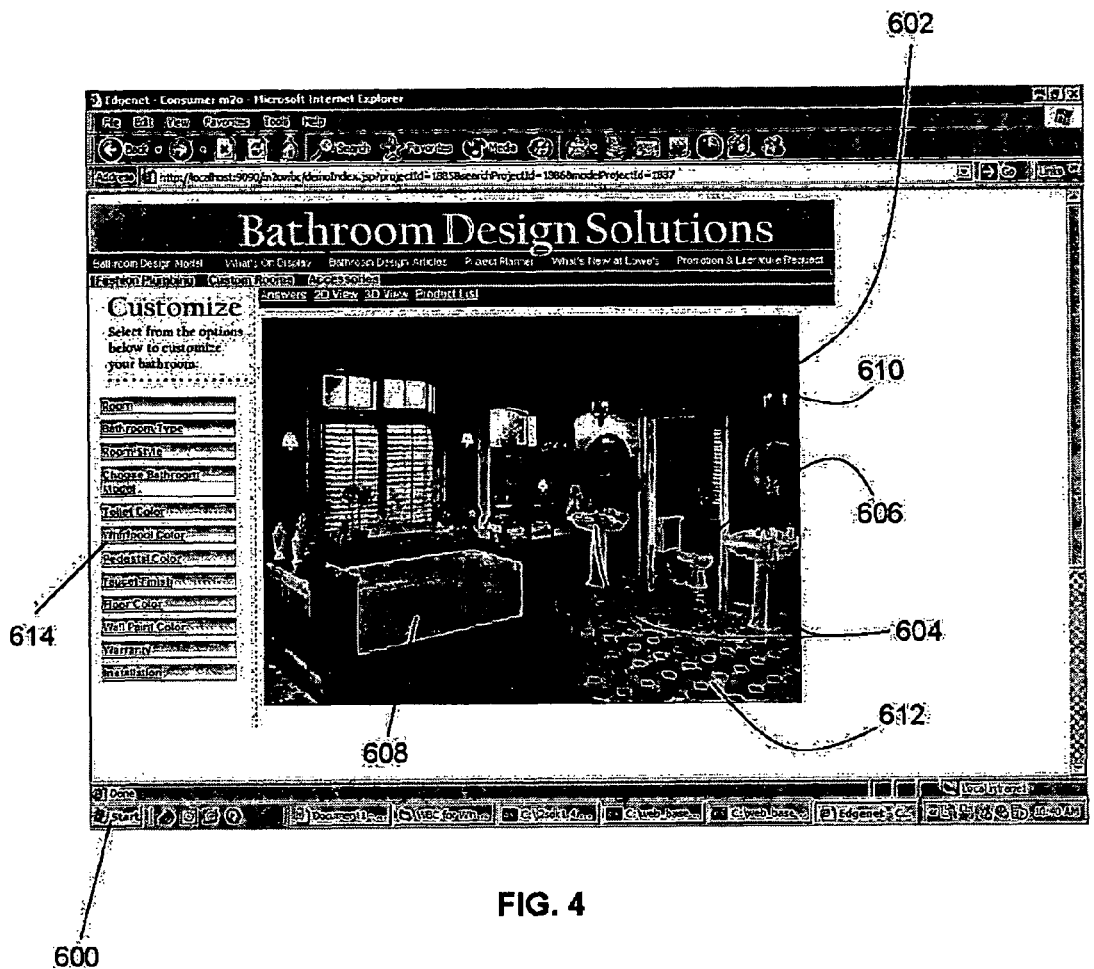

Referring now to FIG. 3, assuming that the user wishes to configure the bathroom associated with the "Gentleman's Retreat" 502 model, the user selects the linked photograph 502, selects "Gentleman's Retreat" 502 from menu 510, clicks on the image label, or otherwise indicates the intention. As a result, the system retrieves the data concerning the components making up the pre-configured model and produces graphical images of the pre-configured components. These graphical images can be viewed by a user (through a user interface, e.g., PC 100), as shown in FIG. 4. FIG. 4 is an exemplary graphical image in the form of screen shot 600 that illustrates a 2-dimensional (2-D) image of a Gentleman's Retreat bathroom model 602. This model bathroom is characterized by a pre-selected arrangement of fixtures including sinks 604, commode 606, tub 608, wall color 610, flooring 612, and other fixtures and products.

Each component selected for bathroom model 602 (e.g., the tub 608) has various attributes stored in database 108. The tub 608, for example, as used in room model 602, has specific dimensions, available colors, material, and price. In keeping with the Gentleman's Retreat style, the attributes of the tub 602 will be limited or constrained (i.e., limitations placed on attributes that can be used in the Gentleman's Retreat style). For example, the tub 602 may be limited to colors such as white and off-white, the material of the tub 602 might be of a porcelain-type material, metal material, or a polymer material, etc. These constraints imposed by the selection of the Gentleman's Retreat style are typically pre-determined (e.g., for example, by the retailer) and may determine the set of component attributes (or the components themselves) from which a user can choose to include in the room to be configured. A given room style model may have other configurable attributes related to the room. These attributes may include size, shape, style, texture, etc. of the room or components within the room, as well as cost figures (e.g., budget or price range of a given product, project, etc.).

Constraints on values of the component attributes can be provided directly by the user (or other entities), be obtained from database 108, derived from a combination of both, or otherwise provided as an input to the system. For example, constraints can include space planning constraints according to standards like the NKBA (National Kitchen and Bath Association) rules, which, for example, specify where a sink might be located in the room relative to a tub. Site-specific realities could be taken into consideration as well (e.g., no piping in a region of a given bathroom precluding the building of a sink in that region).

It will be appreciated that the constraints may be implemented from a spatial point of view as one or more of point-to-point constraints (e.g., an immobile camera as the perspective from which the pictorial view is rendered), point-to-line constraints (e.g., where piping may be located), or point-to-plane restraints (e.g., where a mirror is located on a wall). Further, constraints may apply to 2-D but not 3-D models, to 3-D but not 2-D models, etc.

A retailer may recommend certain products which default as the first choices for a given room style (e.g., Gentleman's Retreat) selected by the user. This is beneficial for a retailer that wishes to promote one or more brands. While only one product may be recommended by the retailer, there may very well be several others that also fit the same description and fit within the user-specific constraints.

Figure 5:
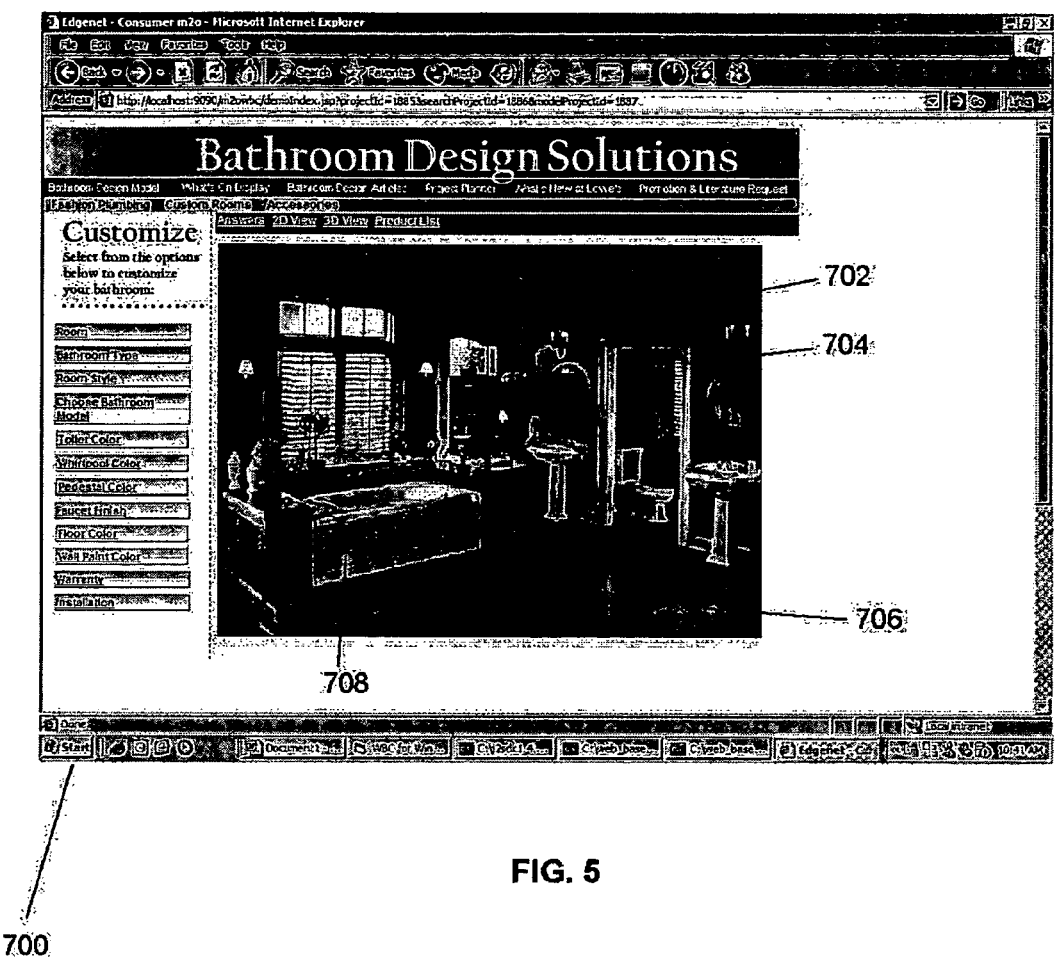

In accordance with an exemplary embodiment of the invention, although a given room design is pre-configured with a set of recommended components for each given room style, the user, e.g., the consumer browsing the system at home on a PC, may further customize the components (e.g., selection, arrangement, etc.) as used in the room to be configured. For example, to customize the bathroom model selected, the user may wish to change the flooring 612. To accomplish this, the user selects the flooring attribute and modifies it by selecting the flooring 612 on the display screen or employing a menu 614 that enables input of the flooring alternative (e.g., change floor color, type, material, etc.). Upon modification of the component attribute, the applications server (106 of FIG. 1) has reconfigured the room according to the desired preference. Once the flooring attribute is changed, the configuration will include the new flooring attribute and the system will output an updated graphical image showing the configuration with the new flooring attribute (e.g., 706, as seen in FIG. 5). As shown between screen shots of FIGS. 4 and 5, the original tile flooring 612 (FIG. 4) with a diamond-shaped pattern on a light background is changed (FIG. 5) to flooring 706 with a wood-grained appearance.

Of course, other attributes of any component of the room model 602 may be changed by the user. For example, the user may choose to modify the tub 608 style. This would be accomplished by selecting the tub 608 and choosing from a plurality of other tub styles stored in database 108. The same can be done for any component in the room where the list of available components and/or attributes depends on pre-selected constraints (e.g., which have been imposed by the retailer, the user, or other). For example, in this exemplary embodiment, the retailer has pre-determined the attributes of other tubs that would be suitable for use in the Gentleman's Retreat style room model 602 aside from the one recommended tub 608. The list of other available tubs may also be shortened or lengthened depending upon other data entered by the user (e.g., budgeting constraints, room size constraints, etc.).

FIGS. 4 and 5 also illustrate the resulting product of a feature of a preferred embodiment of the invention referred to as "layering functionality." Layering functionality simplifies and makes more efficient the processing of numerous high-quality images as the user makes selections in real-time. Where each component in a room could be selected from a plurality of different alternatives, multiple unique images could be generated and stored to present the user with all possible selections. For example, in an exemplary scenario, where the wall color could be selected from 100 different colors, cabinets selected from 10 different types of cabinets, and flooring selected from 10 different types of floors, 10,000 unique images would have to be generated and stored. In accordance with a system employing the layering functionality in accordance with a preferred embodiment, however, an image of the room can be divided into separate layers (e.g., three layers: wall colors, cabinet type, and floor style) such that only 121 images (including the original image) need to be stored under the same scenario.

Figure 6:
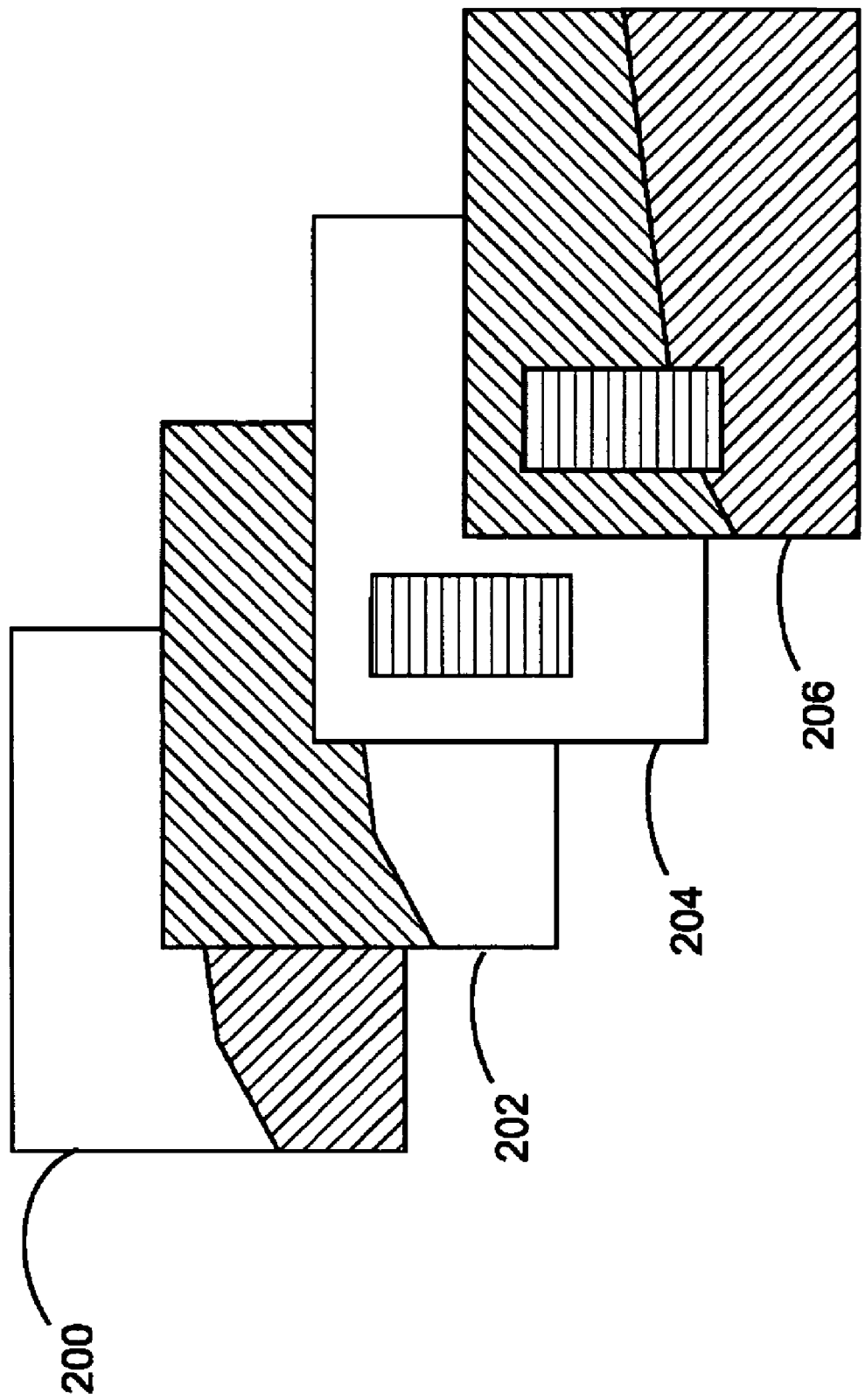
FIG. 6 illustrates layering functionality in accordance with a preferred embodiment of the invention.

Generating these layers can be accomplished by modeling three-dimensional (3-D) information onto a 2-D image. That is, an original 2-D image of, for example, a room, is processed by the automated system designer manually (or automatically by the system) such that 3-D reference data is added to the data of the original 2-D image. The 3-D information so modeled can include location of the camera, location and intensity of light sources in the picture, identification of various planes (i.e., floor, counter-level, cabinet bottoms, cabinet tops intersecting walls, roof, floor, etc.), 3-D identification of components like counter-tops, cabinets, etc., and three-dimensional visual behavior data of components like cabinet doors. The 3-D data added to the 2-D image may be stored, for example, in a commercially available image rendering software package. This 3-D information is used by 3-D rendering tools to separate the picture into layers 200, 202 and 204, as seen in FIG. 6.

In a preferred embodiment, the system generates individual layers, each exclusively depicting at least one component (e.g., floor, wall, cabinet, etc.) on a single layer. The generation of such layers may be accomplished with a commercially available image processing package such as, for example, Adobe Photoshop, etc. The single layer presents the depicted component with its recommended (or customized) attributes (e.g., size, proportion, spatial arrangement, etc.), while the remaining portion of the layer is made transparent. In the exemplary scenario discussed above, the system could be used to generate three new images in addition to the original image (as shown in FIG. 6): a floor layer (200) that depicts only the floor; a wall layer (202) with only the walls showing; and a cabinet layer (204) with only cabinets showing.

Next, each layer is processed, or re-rendered, by a rendering engine. In accordance with a preferred embodiment, a commercially available engine may be used such as, for example, Adobe Photoshop, GIMP, etc. Preferably, the rendering engine takes each 2-D layer image along with the 3-D information and generates all the required variants of the layer. For example, all 100 variants of the wall color layer are generated and stored prior to the user requesting that color. The same process is used to pre-generate all 10 cabinet styles and all 10 floor styles, etc. (This process may be performed by the software in batch offline, so that the variants of the layers can be generated with very high quality.) As previously mentioned, the total number of images generated is 100+10+10+1=121, rather than 10,000.

The 121 images are then indexed and stored. The index to these images stores a sequence in which these images need to be superimposed. The sequence of superimposition and the correct image set from the library of 121 pictures is thus identified and a unique sequence of superimposed images for each of the 10,000 possible combinations is generated.

It will be readily appreciated by those of skill in the art that each layer (e.g., wall, floor, commode, tub, etc.) can comprise multiple attributes (e.g., color, texture, materials, finish, etc.).

In accordance with a preferred embodiment of the invention, visual attributes of a given room are also linked to dynamic catalog data. For example, in accordance with a preferred embodiment, a database 108 is compiled comprising products available for use in room configuration. The database may include product information from many different manufacturers including product color, size, compatibility with other products, pricing, etc. That is, the product parameters found in one or more manufacturer's catalogs are included in the database. For example, when a user selects a white tub, there may be several different white tubs (supplied by several manufacturers) in the database 108. However, based on the applicable constraints, only a subset of those white tubs may be suitable for use in the user-selected room style (e.g., Gentleman's Retreat), thus narrowing the field of suitable tubs.

Figure 7:
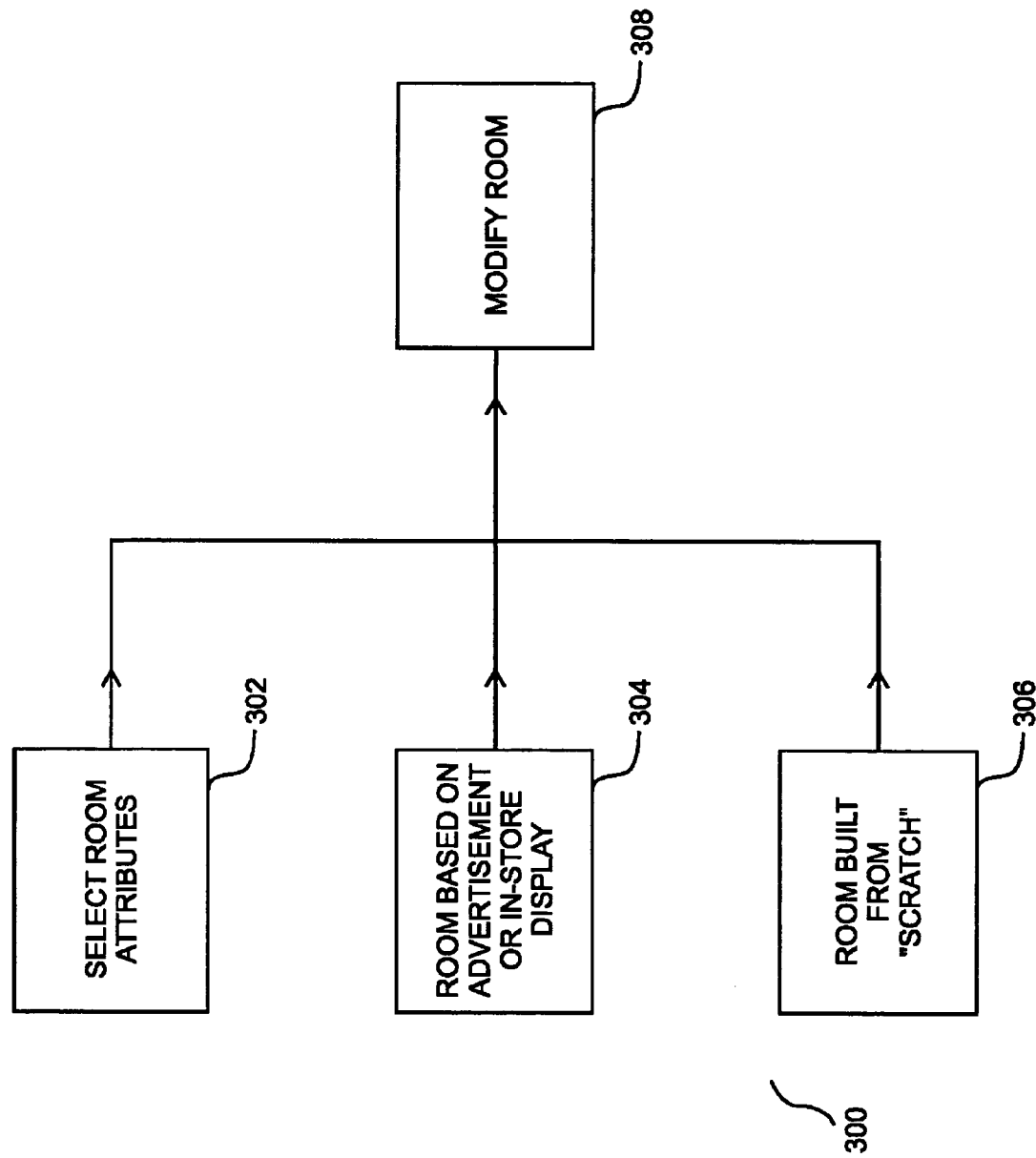
FIG. 7 illustrates user entry points in accordance with a preferred embodiment of the invention.

In accordance with a preferred embodiment of the invention, the system provides a plurality of entry points by which a user can undertake room configuration. An exemplary implementation of a plurality of entry points is represented by entry points 300 in FIG. 7. Entry point 302 represents the above-described process in which the customer preferably selects a room (e.g., bathroom or kitchen), room type (e.g., master bath or guest bath), room style (e.g., traditional or contemporary), and/or a room layout. The user will then be presented with a suggested room design, populated with matching fixtures and other components.

Another entry point 304 represents the presentation of a room based on an advertisement or in-store display. At this entry point, the customer can select from room models that are pre-configured as in an advertisement (e.g., magazine, television, Internet, etc.), in-store display, or other promotional presentation.

In entry point 306, the customer can design his or her own room from "scratch." This may also be considered "expert mode." The customer can select any components in database 108 (or other sources) for use as specified to create completely customized rooms.

After any of the entry points 302, 304, 306, a user has an opportunity (at point 308) to modify one or more components or other aspects of the configured room.

In accordance with a preferred embodiment of the invention, carrying out object configuration may utilize an inheritance-based approach to modeling the data. A room, for example, is defined by certain attributes, including: wall colors and textures; floor types, colors and textures; cabinet types and colors; counter top types and colors; and fixture types and colors. A room can be customized or otherwise specialized. A kitchen may have a stove type, dishwasher type and refrigerator type as additional descriptors. A bathroom has a sink type, bathtub type, faucet type, etc. The kitchen further can be specialized into L-Shaped, galley, etc. The bathroom specializes into master, powder, etc. Each level of specialization presents certain attribute constraints. In accordance with an embodiment of the invention, each of the user-selectable attributes are further linked to additional attributes such as engineering specifications of the various manufacturers' products (size, capacity, etc.) that fit into the specific room.

In accordance with an embodiment of the invention, the system guides the user via a series of questions to select the attributes (e.g., visual attributes) of the object (e.g., room) being designed or configured. These choices change the look of the object and at the same time are dynamically linked to specifications, engineering and other product data of the various different manufacturers' products or components that are needed to make the object.

Figure 8:
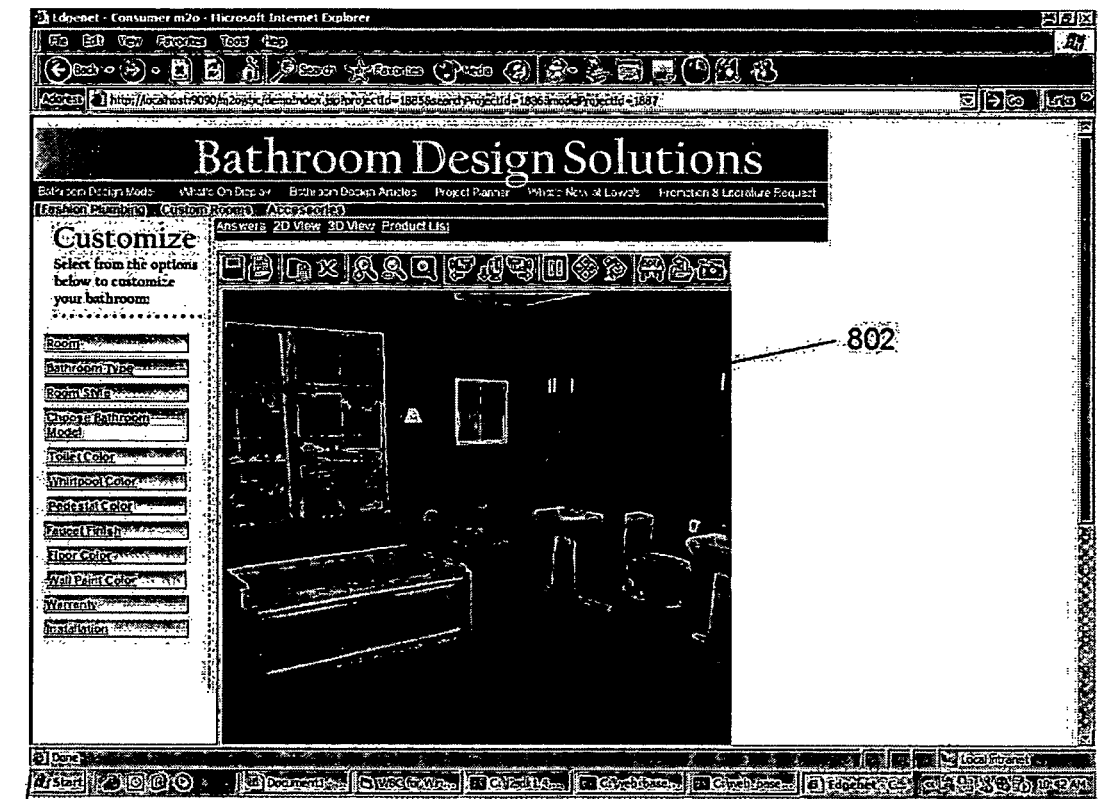
FIG. 8 depicts an exemplary screen shot of a three-dimensional model employed in a commercial implementation of a preferred embodiment of the invention.

In accordance with a preferred embodiment of the invention, at any time during the object configuration, the user is able to view a 3-D rendering of the object as configured so far. FIG. 8, for example, illustrates a screen shot 800 that represents an exemplary rendering 802 of a room during the configuration operation. Using this rendering during the configuration, the user is able to benefit from a pictorial rendering of the relationship in order to visualize the room so configured. The 3-D model presents a view that enables the user to gain different perspectives inside the room and to visualize better how the room will look.

In accordance with a preferred embodiment of the invention, the 3-D view is navigable. That is, the user is able to navigate through the view to approach or retreat from the room, "walk" through the room to see it from a different angle, etc. The 3-D viewer used may be one that is generally commercially available, such as one developed by View 22 Technology, Inc.

In accordance with an embodiment of the invention, while viewing the 3-D rendering of the room, space planning decisions may be integrated with product feature decisions. As a result, the user is able to move components about the room, add components, delete components, etc. The system identifies a 3-D model based on engineering and other attributes. These 3-D models are then available to interact with a three-dimensional software representation of a room and associated space planning constraints, including but not limited to the NKBA (National Kitchen and Bath Association) rules.

In accordance with a preferred embodiment, the system can model product catalogs that link product attributes to three-dimensional models. In the embodiment, the linking can be accomplished by modeling the product attribute data in a hierarchy of specialization layers. These layers of specialization are arranged in a tree structure. Each node of the tree represents data that effectively overwrites or extends the attributes of the product group it specializes (the parent node). A node, for example, can be used to overwrite the dimensions and the three-dimensional component features. In an exemplary operation, the user may start with the engineering attributes deduced from the visual decisions made at the room design session. The system then helps the user pick more of the engineering attributes that continuously overwrite the most appropriate three-dimensional model. The three-dimensional model is then introduced into a three-dimensional representation of a room with space-related constraints.

Figure 9:
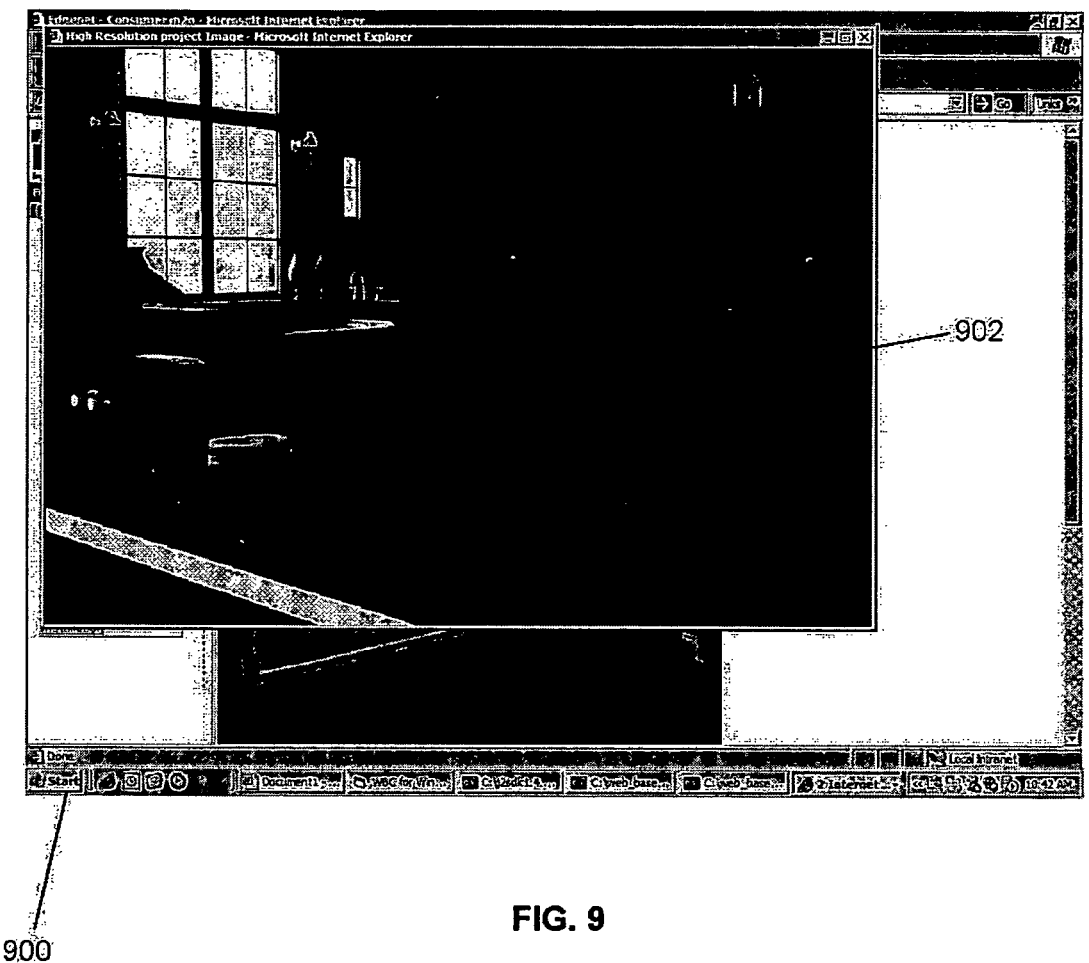
FIG. 9 depicts an exemplary screen shot of a photorealistic rendering employed in a commercial implementation of a preferred embodiment of the invention.

In a preferred embodiment of the invention, the user is able to view a high-quality photograph-based image 902 of the room so re-configured, as shown in FIG. 9, on screen shot 900. The image enables even greater detail and realism, permitting the custom-configured bathroom to be seen virtually as it will be in the actual bathroom itself. As can be seen, the locations of the objects within the room and the number of objects in the room differ from that of FIGS. 4, 5 and 8.

In accordance with a preferred embodiment of the invention, whether graphics are employed or not, the configured room is a construct that may take into account many attributes and interrelationships and dependencies thereof. It may take into account relationships between and among attributes of the components making up the room, attributes of the space defining the area in which the components are to be placed, and the relationship of multiple components.

In accordance with a preferred embodiment of the invention, an object hierarchy or inheritance (e.g., frame-based) functionality may be used to process knowledge (e.g., data concerning components, space, etc.) used in the system, which may be supplemented by an interpreted rules system. The components may be, for example, products such as room fixtures, and the space may be a given room. In a typical example, the components and the room have specified attributes. By way of non-limiting example, component attributes include but are not limited to type of product, size, color, material, price range, etc. And, by way of non-limiting example, room attributes may include but are not limited to room size, layout, style and price range.

In accordance with a preferred embodiment, user data is input through user input of answers to a series of questions regarding configuration of objects. When given the value of one or more answers, the system infers the values of answers to other questions automatically, and thus eliminates the need for excessive rule constructs, as typically required in a rules-based system. Through inference, the system may also remove or insert questions (and their associated answers) based on the user's previous response(s).

As the artisan will appreciate, attribute-based functionality can be obtained by using an attribute inheritance engine (sometimes referred to generically as a frame-engine). However, although one of skill in the art will understand how to implement the functionality in accordance with the invention, the precise nature of the modules as programmed may differ in light of individual circumstances, taking into account, for example, functional specifications that need to be met, the programmer's style, and interoperability with other programs.

In accordance with a preferred embodiment of the invention, the system is primarily constructed using an object hierarchy or inheritance (e.g., an attribute-based) knowledge organization, representation, and classification. Attribute-based and rule-based expert systems encode knowledge using fundamentally different models.

In the context of product configuration, the problem an expert system is supposed to solve is as follows: given a set of options ("questions" to be presented to the user), each of which has a set of legal attributes ("values" with which the user may answer the questions), how are the options/attributes themselves related to each other (which options/attributes remove [or "constrain away"] other options/attributes, which options/attributes are "interdependent", etc.).

As an example, if the user has answered options A, B, and C with attributes x, y, and z, the expert system must then determine what are now the legal attributes for some other option D. In order to do this, an expert system first has to encode the relationship between the options in some manner (i.e., represent the knowledge). Then, as the expert system is provided current choices as inputs in real time (i.e., "the user has answered options A, B, and C with attributes x, y, and z"), the system must now apply its encoded knowledge to the problem "what are the legal attributes for D" in order to supply the solution(s).

A rule-based expert system generally represents knowledge using a large collection of If-Then-Else constructs (i.e., "If the user has answered option 'A' with attribute 'x', Then attribute 'y' is no longer available for option 'B', Else . . . "). This approach, however, is a unidirectional encoding: if the conditional portion (the user has answered option "A" with attribute "x") of the statement is true, the resultant portion must also be true (attribute "y" is no longer available for option "B"). The converse (if attribute "y" is no longer available for option "B", then the user has answered option "A" with "x") is not necessarily true, nor in general should it be.

However, a rule-based expert system requires that the inverse rule must be written separately if it is deemed necessary. If the product knowledge being modeled is complex, the required rules and inverse rules can grow into a very large number. In addition, applying this type of knowledge representation to the problem "the user has answered options A, B, C with attributes x, y, z; now what are the legal attributes for this other option D" involves using an interpreter or compiler that understands the rule syntax so as to apply the rules to the problem.

On the other hand, the attribute-based functionality as used in a preferred embodiment of the invention encodes knowledge in an entirely different manner that does not suffer from this "inverse rule" problem. The knowledge is represented in the object hierarchy in a hierarchical tree-like structure. The nodes of the tree are generically called "frames" (e.g., corresponding to product categories) and each node contains a collection of "slots" (e.g., corresponding to product features and options). A slot is a one-to-many relationship between an option and a subset of the legal values (e.g., attributes) for that option.

Textually, a slot is represented as follows:

A=x,y,z where "A" is an option, and "x", "y", and "z" are attributes for option A.

In general, in the type of object hierarchy known as frame/slot hierarchy, a frame contains multiple slots, and has child frames as well (because of the tree structure). Conceptually, all the slots in a frame "go together." If at least one of the slots in a frame is found to be invalid (e.g., Slot "A=x, y, z" is in a particular frame, but the user has answered "A" with attribute "w"), then the entire frame (along with all of its other slots and all of its child frames) is invalid. Functionally, products and attributes in such a frame are removed from the configuration process. Applying this knowledge representation to the problem "the user has answered options A, B, and C with attributes x, y, and z—now what are the legal attributes for this other option D" involves first marking the appropriate portions of the tree invalid as the user supplies answers to options. Then, to actually provide an answer to the question "what are the legal attributes for some other option D" the features will look for all the frames which have not been marked invalid and which reference "D" (i.e., have a slot involving "D") and then combine all the attributes found in these slots (eliminating any duplicates). At the conclusion of this process, the answer (in many cases, a multi-faceted answer in terms of associated data [a price, an image, a set of drawings, etc.]) is generated and displayed.

In accordance with a preferred embodiment of the invention, incorporating component knowledge into the frame-based system enhances its operation.

The following simple example will illustrate the differences between an If-Then-Else rule based system and one utilizing frame-based functionality in accordance with a preferred embodiment of the invention.

Assume there are four people who are identified by a letter, color, and number.

Jim is A, Blue, and 3.
Ted is B, Red, and 2.
Randy is A, Red, and 4.
Roy is B, Blue, and 2.

The first screen in an application would prompt the user for choosing a letter. (As an additional requirement, the questions can be answered in any order, and the user might skip the first screen and come back to it later.) The If-Then-Else rules to handle such option/attribute pairs are as follows:

if Color has no answer and Number has no answer then
   Letter is A or B
else if Color has no answer then
   if Number is 3 or Number is 4 then
     Letter is A
   if Number is 2 then
     Letter is B
else if Number has no answer then
   Letter is A or B
else if Color is Blue and Number is 3 then
   Letter is A
else if Color is Red and Number is 2 then
   Letter is B
else if Color is Red and Number is 4 then
   Letter is A
else if Color is Blue and Number is 2 then
   Letter is B Two more sets of rules will still have to be written for the Color screen and the Number screen. The difficulty of adding a new person to the data or adding another class of question to determine the group's favorite fruit can easily be seen.

In contrast, the frame based functionality utilized by the invention permits the entry of that same data as follows. After adding the four questions to the system, add the following compound slot:

| LETTER | COLOR | NUMBER | PERSON |
|--------|-------|--------|--------|
| A | Blue | 3 | Jim |
| B | Red | 2 | Ted |
| A | Red | 4 | Randy |
| B | Blue | 2 | Roy |

To add a new person, a new row is simply inserted, adding the new person's letter, color, number, and name. To add another question such as the group's favorite fruit, a new column is simply added to the slot, and a list of everyone's favorite fruit can be added.

While the actual algorithms as implemented are likely to be much more complex, the following illustration may be useful:

In the beginning of a configuration session all frames are valid, and the example above has four frames, one for each row. When asked for the list of available answers for any question, the system looks down the column for that question.

If the row is valid, its answer is added. Accordingly, for the Letter question, the system sees A, B, A, B. The duplicate answers are combined to arrive at A, B. Now suppose the user answers A. This means that unless the frame has Letter=A, it is invalid. The second and fourth rows are thus invalid. Next the user is presented with the Color question. To find the answers, search down the Color column; the result is Blue and Red for the available answers (Blue from the first row and Red from the third). The user picks Blue. This choice makes the second and third rows invalid.

As a result, there is only one valid row left, the first row. The user has effectively finished the selection process by answering only two of the three questions.

Frame-based operation is particularly useful when applied to real-world, complex product knowledge challenges. Real-world product knowledge contains relationships between products, knowledge common among similar products, knowledge common among different products, and exceptions to all of the above.

Figure 10:
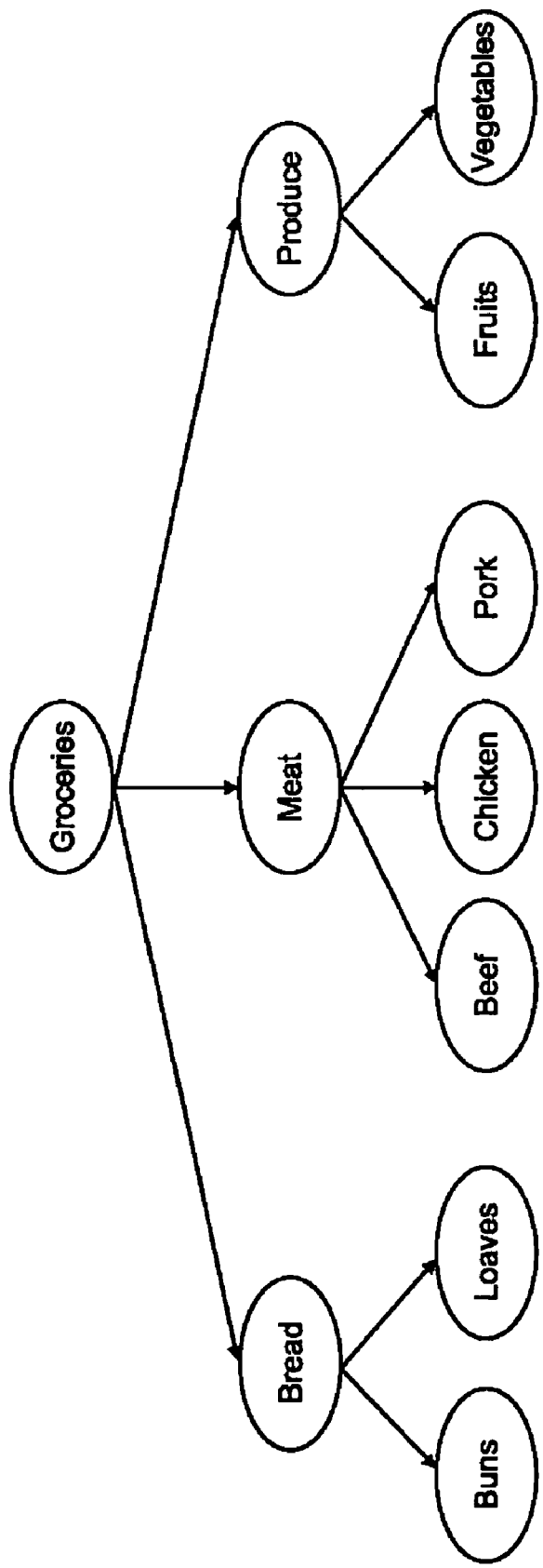
FIGS. 10 and 11 are illustrations of hierarchical structures used in accordance with a preferred embodiment of the invention.
Figure 11:
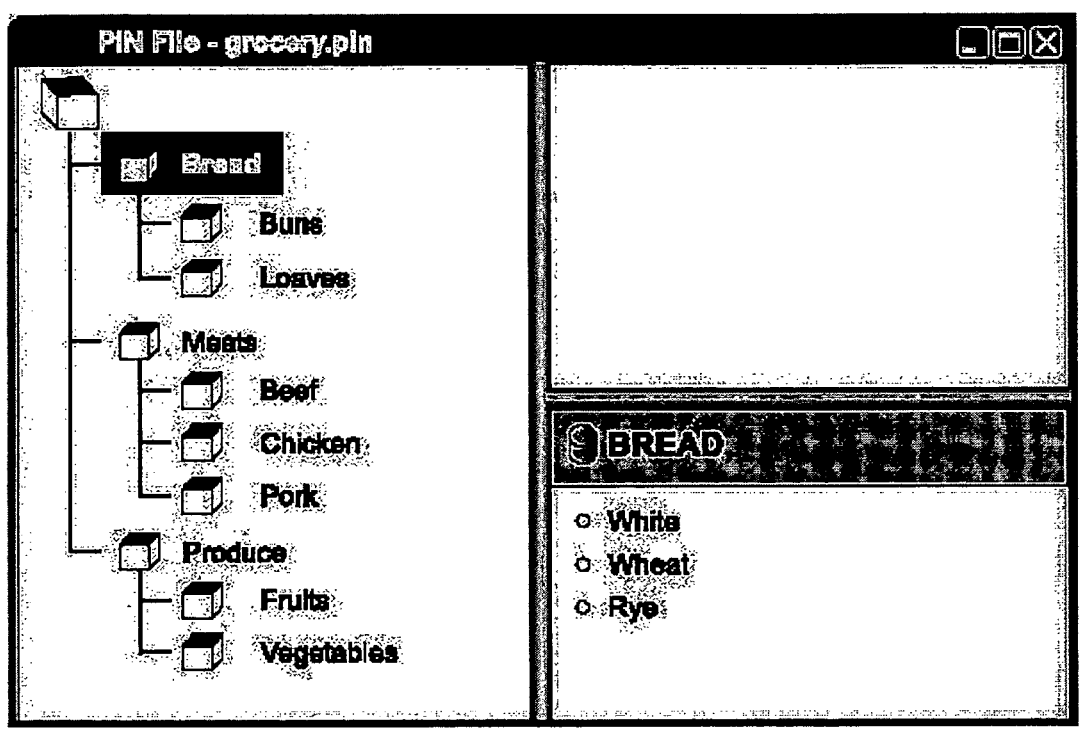

An important relationship among products can be expressed as: "Product A is a type of Product B" (e.g., a casement is a type of window, a car is a type of vehicle). This relationship is called inheritance. Inheritance is a parent to child relationship, but not in the traditional sense. In human beings, if a parent has a trait, the child may or may not share that trait (e.g., brown hair). In this form of knowledge inheritance, the child must inherit all traits. Inheritance is important, because it allows the software engineer to combine all the identical traits for the children in one logical place: the parent. Each frame is a parent with children, which in turn have their own children. For example, if there were a system for selecting groceries, the logical way to organize the data would look something like that shown in FIG. 10. The frame based system allows the construction of this tree with the result illustrated in FIG. 11.

As illustrated, when the Bread frame is selected, there is a trait defined as bread. This means that all types of buns and loaves can be made out of White, Wheat, or Rye bread, because both Buns and Loaves inherit from Bread. If any special types of Buns were defined by adding "children" to the Buns frame (i.e., hamburger or hot dog) these new types also inherit White, Wheat, or Rye. Children inherit everything from their parents, grandparents, and great-grandparents, all the way up the tree. In the future, if the store added Pumpernickel and carried it for all types of bread, such information could be added to the Bread frame. If the store offered Pumpernickel for Loaves only and not Buns, then Pumpernickel could be added to the Loaves frame. Without the power of inheritance, Pumpernickel would have to be manually added to every type of bread.

There are some types of product knowledge that may be shared among different frames in the tree, but which cannot use inheritance. In the groceries example, a trait of this sort would be packaging. Not all groceries come in packages, and sometimes the same kind of product might be available with or without packaging (for example, packaged bread versus bread from the deli). If packaging is available, there will be some product knowledge that applies to all packaging (e.g., servings per container). A frame can be defined by itself to represent such knowledge, which can then be added into the tree at whatever points are appropriate.

In accordance with a preferred embodiment, although frame-based inference is used, the system also includes the ability to process data using rules files, enabling the approach to be more of a hybrid as desired. It is foreseeable that some custom answers are more conveniently handled using rules files rather than building the product knowledge. A rules-based filtering methodology may be used, for example, for filtering output from the frame-based functionality to comply with certain rules established for a particular product, product attributes, room attributes, or a combination thereof. Similar filtering of unwanted answers, or inapplicable questions may be useful. Rules-based functionality may also be used to add special answers, perform calculations, generate user warnings, or any other special processing required for specific system implementations. Rules-based functionality may be particularly suited for computing the price of a room and distribution of any discounts that are available to the room.

In accordance with a preferred embodiment, rules-based functionality may be added to supplement the operation of frame-based functionality. Rules-based functionality is typically employed to handle special cases, exceptions, and functionality that are specific to a product line or product series.

In accordance with a preferred embodiment, any number of additional modules may be added to serve a supportive and optional role (called on an "as-needed" basis). Such modules may relate to pricing. For example, price reports can be graphically generated and prices can be calculated and displayed to the user in multiple currency types. Further, a CAD (Computer Aided Design) module may be added to read CAD drawings and enable multiple CAD drawings to be displayed simultaneously, with separate components to be overlaid upon one another to form a complex illustration. Specifically, the CAD functionality may handle the determination of which components need to be overlaid and may present a list of the files containing the required components to a CAD control, which may in turn read the CAD files and display the components on the user interface. The CAD functionality may also print, copy or otherwise output the CAD files.

In addition, instead of inputting user data (e.g., room or house dimensions) from scratch, the user may initiate access to an input file (e.g., CAD file) with such data.

Further, the system may be programmed to output files (e.g., CAD files) once all components have been specified and located in a room. In this manner, a contractor can effectively work with the object as configured by the customer.

A preferences module may also be included in the system. A preferences module allows the user to define a set of preferred answers for questions applicable to the design choices. In a preferred embodiment, the set of preferred answers may be based on user-selected preferences, regional specification preferences, manufacturer compatibility preferences, etc. As an example, the user can initiate a configuration session and choose a desired fixture brand, such as Kohler. The user can then set Kohler as a preference for that entire project. As a result, in considering the object attributes, the system will reference the preferences module and will automatically retrieve the preference values by default and override other items. The preferences module can also automatically inform a user that the selected preference is unavailable for a given product during the configuration of that product.

Figure 12:
FIG. 12 depicts an exemplary screen shot of a bill of materials employed in a commercial implementation of a preferred embodiment of the invention.
Figure 13:
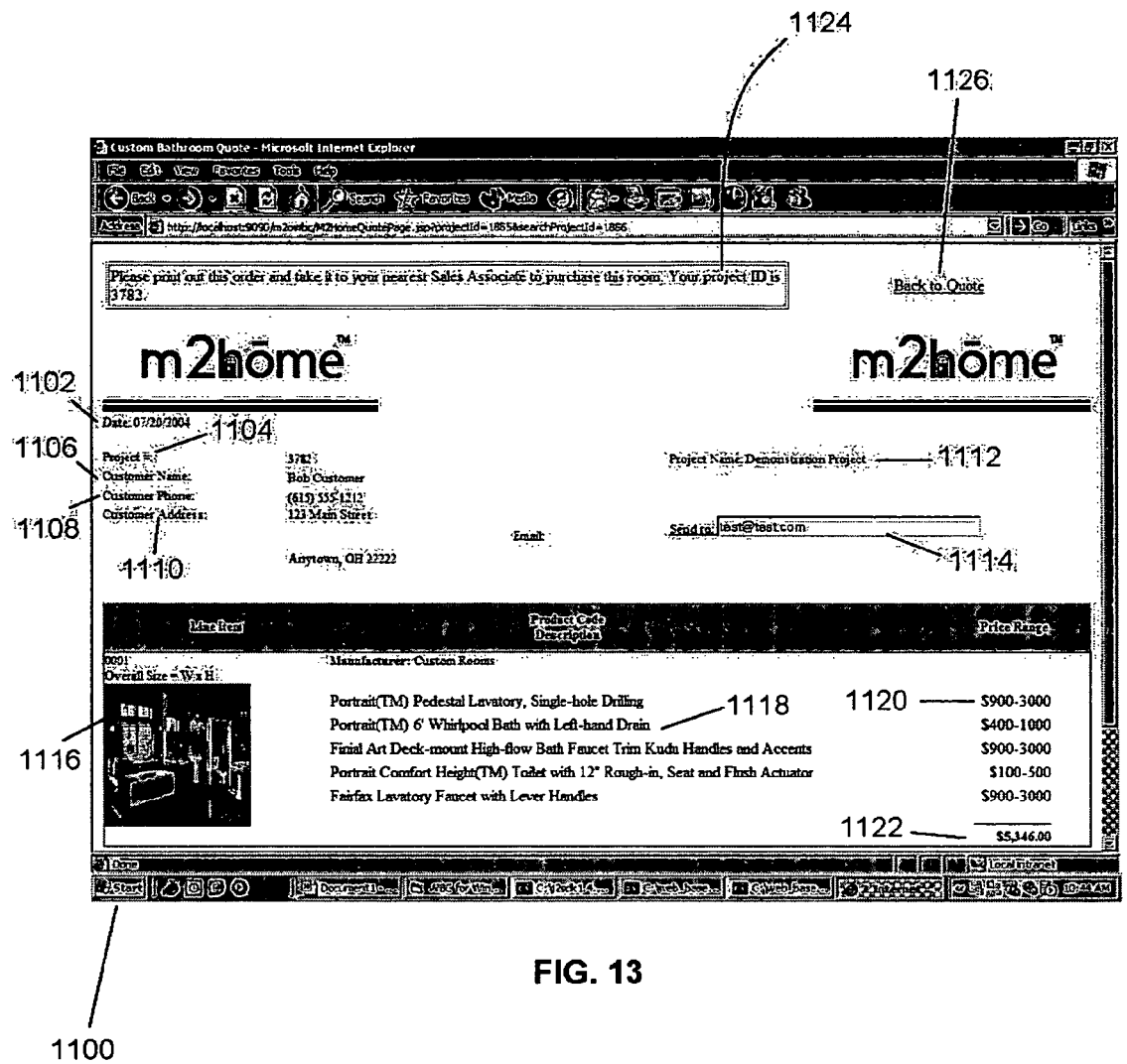
FIG. 13 depicts an exemplary screen shot of a quote employed in a commercial implementation of a preferred embodiment of the invention.
Figure 14:
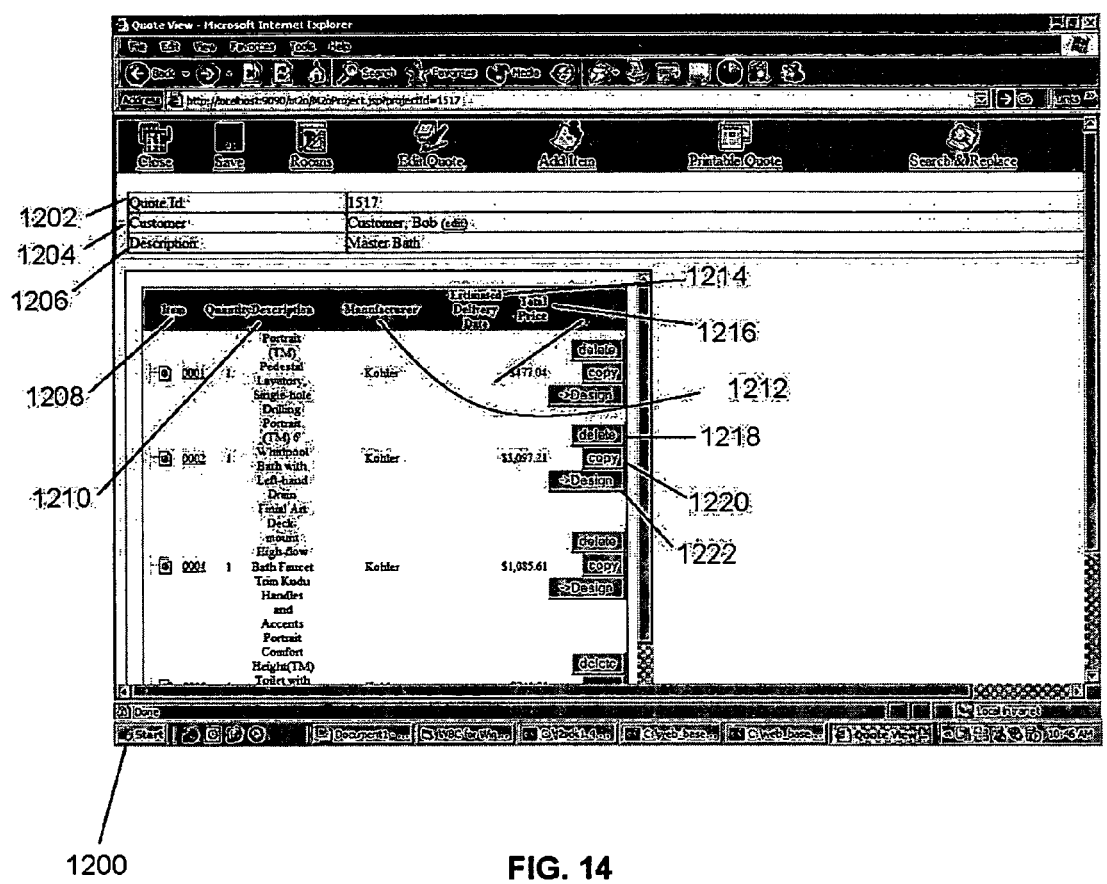
FIG. 14 depicts an exemplary screen shot of a shopping cart employed in a commercial implementation of a preferred embodiment of the invention.

The above features can further be made part of a turnkey home-design solution by enabling the user to view a bill of materials and pricing range for the customized project (as shown in FIG. 12), generate a quote for the bill of materials (as shown in FIG. 13), and convert the configuration project into a shopping cart view and execute the purchase after changing any product attributes from the detailed product database (as seen in FIG. 14).

The user is able to view a bill of materials and pricing range for a particular project. FIG. 12 illustrates a screen shot 1000 of an exemplary implementation of a preferred embodiment of the invention. As shown, the products 1002 will populate the room. A quantity 1004 is shown for each product. A model number 1006 is given for each product. Also, a description 1008 is given for the product. If appropriate, a color/finish 1010 is given. Further, a price range 1012 is supplied. Additionally, the user has the option to save the room 1014. By saving the room, the attributes selected are saved for later use. Even more, the user has the option to email the room 1016 so configured to another user. The other user may be, for example, a family member for his or her review. Alternatively, the other user may be a merchant who is able to carry out the purchasing and installation of the room so configured, or give advice.

In accordance with a preferred embodiment, a quote for the bill of materials may be generated. FIG. 13 illustrates a screen shot 1100 of an exemplary implementation of a preferred embodiment of the invention. The screen shot 1100 presents: a date 1102, project number 1104, customer name 1106, customer phone 1108, and customer address 1110, as well as a project name 1112 and email address 1114 to which the project can be sent. A graphic representation of the configured room 1116 can be presented, along with product code descriptions 1118 and price ranges 1120 therefor, leading to a total price 1122 calculated from the price ranges 1120. If the user so desires, the screen may suggest 1124 that the user print out the order and give it to a sales associate to purchase the components of the room. The user is also able to return to the quotations given (e.g., as in FIG. 12).

Preferred embodiments of the invention may allow modeling a "has a" relationship between rooms and the components therein. An implemented room configuration system, for example, can refine a list of products (e.g., bill of materials) in a customized room as the attributes of a room change. As an illustration, a room with red walls, silver appliances and wood floor can have GE appliances with model numbers #1234 and #2345R, and red color paint and wood flooring. A different incarnation of a similar room may have Whirlpool #9876 and WPL #5432 appliances, #345 wallpaper and @Asv floor tile from Daltile. As the user modifies the room desired, the "has a" relationships can differ as well.

The user also has the option to consummate the purchase electronically. The user can convert the project into a shopping cart-type view, as shown by the exemplary implementation of a preferred embodiment illustrated in FIG. 14. As shown in the exemplary screen shot 1200, the shopping cart contains data relating to the customized room including, for example, a quote ID 1202, customer 1204, and room description 1206. Further, the shopping cart can contain the item designation 1208, the quantity/description thereof 1210, manufacturer 1212, estimated delivery date 1214 and total price 1216. The user is able to delete 1218 a product from the shopping cart, copy 1220 the product (for example, the user wishes to have two identical sinks), or continue with room design 1222.

Further, from the shopping cart view depicted in FIG. 14, the user may refer back to the 3-D representation (e.g., of FIG. 8) and/or view a plan view of the configured room with the specific appliances now to be finally selected prior to placing the order. In this manner, the user may make last minute substitutions or modifications while viewing both the room and the product specification data as well as pricing.

To implement the functionality expressed in the foregoing features and others, a preferred embodiment of the invention enables use of a knowledge management system to resolve engineering attributes of a product into visual attributes that the user is able to view. Thus, given a certain engineering specification, the preferred embodiment is able to obtain a visual representation of those attributes.

Further, to facilitate custom room design based on the user's understanding of how the room will look, a preferred embodiment of the invention is able to utilize visual attributes of an engineered product to identify the closest graphics-renderable component that will represent the attributes. In doing so, this facilitates accurate custom room design in light of available product features and constraints.

EXAMPLE

The following is an exemplary commercial implementation of a preferred embodiment of the invention. In this implementation, component attributes are evaluated and an explanation of the manner in which this assists in customization is provided.

A number of manufacturers specialize in plumbing-related fixtures that may be used in a bathroom. One of these manufacturers, for example, is Kohler. Kohler makes numerous product models, and each model may differ in size, shape, color, price, material, or other attributes. A Kohler bathtub, for example, may be 6 feet long, have a whirlpool feature, have a left-hand drain, be the color white, and cost from $400 to $1000. This corresponds to a description and the corresponding graphic rendering given in FIG. 12 (bill of materials). With the user having selected a six-foot bath with a left-hand drain, and located it in a given room layout, the frame-based functionality or rules-based functionality or both can be used to make numerous inferences.

Obviously, a commode cannot now be located in the spatial area where the tub is located, nor could any other component be located within the dimensions described by the polygon component that represents the tub. Further, an inference can be made that for practical reasons a sink should not be placed directly next to the tub at a certain spatial orientation, for this would interfere with both use of the sink and the commode. In other words, the user should not be required to stand in the tub to use the sink. This, too, can be accomplished by the inference engine. Besides space and practical constraints, the inference features may be aware of engineering constraints related to a particular component and whether and how it could be used in a particular configuration.

Attribute constraints are not to be viewed solely as limitations. Perhaps the user is partial to the Kohler brand. If so, the user might wish to have as many of the fixtures as possible be Kohler fixtures. The inference features could be programmed to enable a "Kohler as first choice" preference. Additionally, the inference features could be programmed to enable selecting sets of attributes. For example, the user could elect a preference for Kohler products, and further set a capped price at a predetermined amount for the objects in the room. In short, the inference features can be programmed to make multivariable determinations based on user input.

The inference features can be object attribute-based, rule-based or both. Further, the attribute features and rules features are adapted to interact with a database. The data populating the database can be derived from multiple sources. For example, database (e.g., database 108 of FIG. 1) can contain data from vendors, such as product specifications like size or other attributes. Further, database 108 can also contain data generated from the customer, such as the size of the room to be configured or color preferences. Still further, database 108 can contain data obtained from a retailer, e.g., which brands are most up-to-date, most reliable, provide the best value, etc. Accordingly, the database can be an extensive library of accumulated product information from diverse sources, including the vendor, consumer, and retailer.

Photographs of particular products can be embedded in the database 108. Because the visual rendering of the room can be based on photographs of actual products, greater photorealistic room views are possible enabling optimal user customization.

Figure 15:
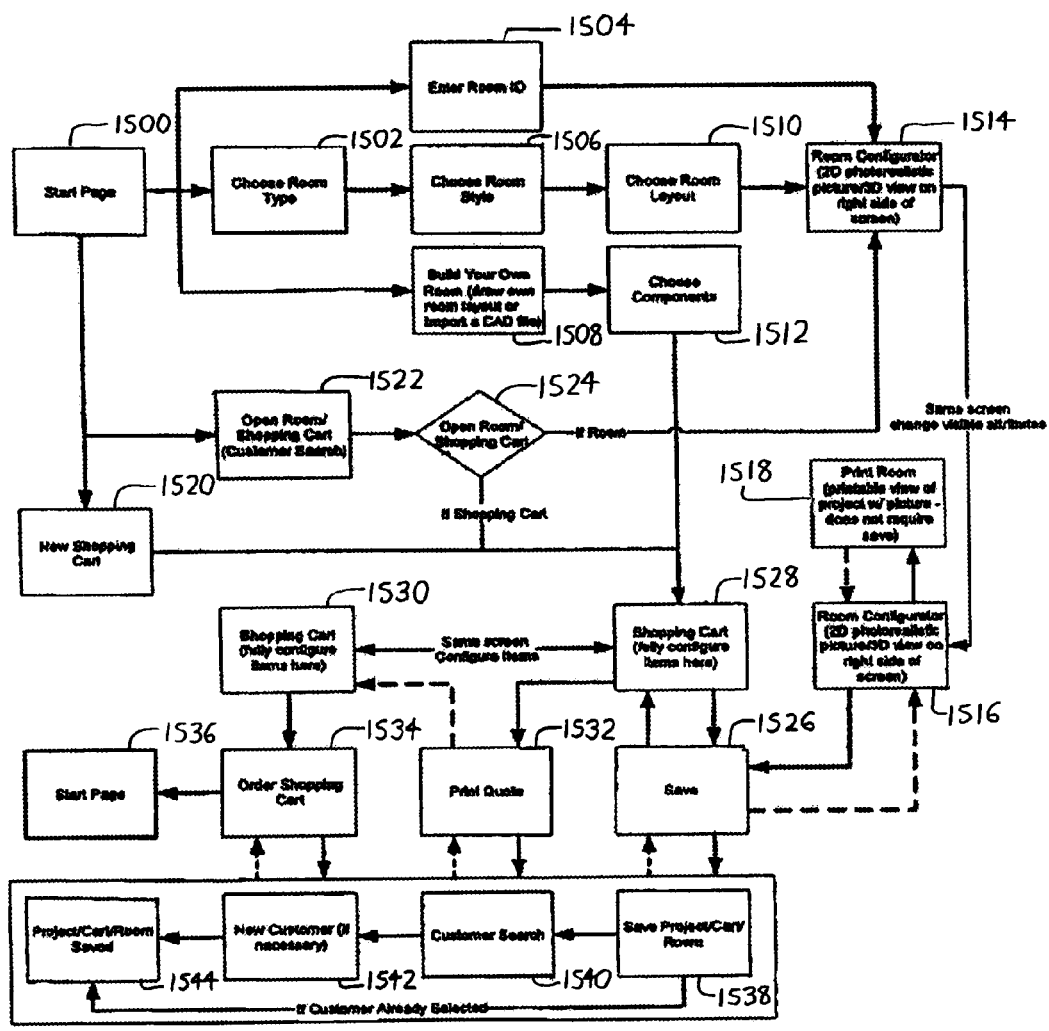
FIG. 15 depicts an exemplary sequence of options presented to the user in configuring a room in accordance with a preferred embodiment of the invention.

An exemplary sequence of options presented to the user of the exemplary commercial implementation in configuring a room is illustrated in FIG. 15. A user can begin at a start page 1500. From here, the user can choose a room type 1502, e.g., bathroom, and room style 1506, e.g., Gentleman's Retreat. This is one method of selecting room attributes 302. Or, from start page 1500 a user may enter a room ID 1504. This is one method of configuring a room based on an advertisement or in-store display 304. Optionally, a user may build a custom room 1508 (i.e., draw one's own layout or import a CAD file). This is one method of building a room from "scratch" 306.

After choosing a room style 1506, a user can choose a room layout 1510, e.g., L-shaped, square, etc. Upon choosing a room layout 1510, the user can engage in room configuration 1514, 1516 (e.g., a 2-D photorealistic picture and/or 3-D view). After engaging in room configuration 1514, 1516, the user may optionally print the room 1518.

After entering at start page 1500, the user can enter a room ID 1504. This is useful where the reader wants a completely preconfigured room. The user may then view and configure the room 1514, 1516.

Still further, the user may enter at the start page 1500, then build a room from scratch 1508. The user will then choose components 1512, which can be added to a shopping cart 1528 where items can be fully configured in advance of purchase.

The user may have performed room configuration at an earlier time. If so, from start page 1500 the user can search for a room or shopping cart 1522 that has been previously stored. Once the room or shopping cart has been opened 1524, the user can engage in room configuration 1514, or configure items by means of a shopping cart 1528.

Still further, after entering at start page 1500 the user may create a new shopping cart 1520, and then configure items by means of a shopping cart 1528 in advance of purchase.

The shopping cart 1528 can be saved 1526 into storage, including but not limited to storage in database 108. Or, in configuring a shopping cart 1528 the user may print a quote 1532 or initiate an ordering process via shopping cart 1534. Upon initiating an ordering process via shopping cart 1534, the user can be led to a new start page 1536, which may be, but is not limited to, start page 1500.

If the project/cart/room is saved 1538, a customer search 1540 may ensue that determines if the customer is new or not. If the customer is new 1542, the project/cart/room can then be saved and associated with the customer.

In accordance with a preferred embodiment of the invention, one or more processor-based (or other processing device-based) systems may be used to implement the modules described or apparent from the description herein and to perform the functionality described (or inherent) herein. For each such system, one or more processors (e.g., central processing unit (CPU)) are provided for execution of one or more computer programs stored on any (one or more) known recording mediums. The processor(s) perform, control, or at least inform the various processing steps performed by the system in sending and retrieving data to and from at least one user interface and/or network. A user interface may be connected directly to a bus or remotely connected through a network (e.g., Internet). The network represents (wired or wireless) connection of two or more devices, whether directly or indirectly connected (e.g., directly coupling through cable, indirect coupling through one or more hubs or servers, whether the network is local to the processor-based system, geographically remote from system, or a distributed combination of local/remote network components).

Preferably, one or more of the modules are coupled (directly or indirectly) to one or more database structures for use in supplying storage functionality for the modules in accordance with the operations described (or inherent) herein. The database structures can take any form from an individual floppy disk drive, hard disk drive, CD-ROM, redundant array of independent devices (RAID) system, to a network of the same or other storage devices. As is well known in the art, the database structures may be physically connected within the same location, or have one or more structures remotely located in different locations. Each module may have dedicated or shared access to one or more database structures locally or remotely located from the module.

While preferred embodiments of the invention have been described and illustrated, it should be apparent that many modifications to the embodiments and implementations of the invention can be made without departing from the spirit or scope of the invention.

It should be readily apparent that any known communication systems or (wired/wireless) networks (e.g., Internet, intranets, private bulletin boards, individual local or wide area networks, proprietary chat rooms, ICQ, IRC channels, instant messaging systems, etc.) using real-time or non-real-time systems may be utilized.

The modules described herein, particularly those illustrated or inherent in the instant disclosure, may be one or more hardware, software, or hybrid components residing in (or distributed among) one or more local or remote computer systems. Although the modules are shown or described as physically separated components, it should be readily apparent that the modules may be combined or further separated into a variety of different components, sharing different resources (including processing units, memory, clock devices, software routines, etc.) as required for the particular implementation of the embodiments disclosed herein. Indeed, even a single general purpose computer executing a computer program stored on an article of manufacture (e.g., recording medium) to produce the functionality and any other memory devices referred to herein may be utilized to implement the illustrated embodiments. User interface devices may be any device used to input and/or output information. The user interface device may be implemented as a graphical user interface (GUI) containing a display or the like, or may be a link to other user input/output devices known in the art. Discrete functionality of the system may be separated (logically or physically) to more efficiently operate the system.

In addition, memory units described herein may be any one or more (integrated or distributed) known storage devices (e.g., Random Access Memory (RAM), Read Only Memory (ROM), hard disk drive (HDD), floppy drive, zip drive, compact disk-ROM, DVD, bubble memory, Redundant Array of Independent Disks (RAID), Network Attached Storage (NAS), Storage Area Network (SAN), etc.), and may also be one or more memory devices embedded within a processor, or shared with one or more of the other components. The computer programs or algorithms described herein may easily be configured as one or more hardware modules, and the hardware modules shown may easily be configured as one or more software modules without departing from the invention. Accordingly, the invention is not limited by the foregoing description, drawings, or specific examples enumerated herein.

What is claimed as new and desired to be protected by Letters Patent of the United States is:

1. A configuration method for a room, the method comprising:
    selecting from a client device a pre-configured consumer application from a plurality of pre-configured consumer applications accessible from the client device, the consumer applications respectively reflecting different decorating styles that may be selected for the room, with each pre-configured consumer application having an associated plurality of room components;
    storing in a memory module data defining a plurality of attributes for each of the plurality of components associated with the room for the selected pre-configured consumer application, wherein the data are organized in a frame/slot hierarchy, wherein the plurality of components are each represented as a first and second set of frames and the plurality of attributes are each represented as slots of the first and second set of frames, respectively;
    selecting a user-specified attribute for at least one of the plurality of the room components, wherein selection of invalid attributes is prevented, comprising:
        performing in a processor-based system an attribute-based inference operation that identifies within the frame/slot hierarchy available attributes and invalid attributes for the at least one of the plurality of room components, wherein the available attributes are identified based on the selected pre-configured consumer application and the at least one of the plurality of room components;
        providing the available attributes for selection; and
        selecting the user-specified attribute from the available attributes provided; and
    generating an image comprising the at least one of the plurality of room components with the user-specified attribute within the room.

2. The method of claim 1 further comprising generating computer-aided-design (CAD) data for facilitating installation of the inferred set of components.

3. The method of claim 1 wherein the frame/slot hierarchy is organized such that the available attributes are defined as being in accordance with a style of the selected pre-configured consumer application and the invalid attributes are defined as not being in accordance with the style of the selected pre-configured consumer application.

4. The method of claim 1 further comprising:
    selecting a second user-specified attribute for the at least one of the plurality of the room components, wherein selection of invalid attributes is prevented, comprising:
        performing in a processor-based system an inference operation that identifies a second set of available attributes within the frame/slot hierarchy for the at least one of the plurality of the room components, wherein the second set of available attributes are identified based on at least the user-specified attribute;
        providing the second set of available attributes for selection; and
        selecting the second user-specified attribute from the second set of available attributes provided; and
    generating an image comprising the at least one of the plurality of room components with the user-specified attribute and the second user-specified attribute.

5. The method of claim 1, further comprising:
    receiving input data at a user interface from a user in the form of computer-aided-design (CAD) data.

6. A configuration method for a room, the method comprising the steps of:
    separating in a processor-based system an image of a pre-configured and user-configurable room into a plurality of layers, each of the layers being respectively associated with one of a plurality of different components of the configurable room;
    storing data in a memory module, wherein the data include a respective plurality of different options for each of the layers, wherein the layers and options are organized in a frame/slot hierarchy that defines for each option for a first layer of the plurality of layers valid and invalid options for a second layer of the plurality of layers wherein the plurality of layers are each represented in a first and second set of frames and the plurality of different options are represented as slots of the first and second set of frames, respectively;
    selecting a user-specified attribute for at least one of a plurality of room components, wherein selection of invalid attributes is prevented, comprising:
        performing in a processor-based system an attribute-based inference operation that identifies within the frame/slot hierarchy available attributes and invalid attributes for the at least one of the plurality of room components, wherein the available attributes are identified based on a selected pre-configured consumer application and at least one of the plurality of room components; and
    specifying options for the first layer and the second layer, wherein specifying a combination of a first option for the first layer with an invalid option for the second layer is prevented by the frame/slot hierarchy.

7. The method of claim 6, wherein the options are related to at least one of size, type, pattern color, material, texture, finish, and price.

8. The method of claim 6, wherein said step of separating comprises:
    generating two-dimensional data of the image; and
    adding three-dimensional reference data to the two-dimensional data of the image.

9. The method of claim 8, wherein said step of adding comprises:
    generating data of at least one of the location of a camera, and the location and intensity of a light source.

10. A method of configuring a room, the method comprising:
    receiving in a processor-based system a pre-configured style selection of the room to be configured as input data;
    generating in the processor-based system at least one room design to match the style selection, the room design having a plurality of components consistent with the selected room style, each of the plurality of components representing at least one set of potential product data;
    changing in the processor-based system an appearance of a first one of the plurality of components based on a user-supplied request to change, wherein the changing includes choosing from a subset of a plurality of options stored in the processor-based system, wherein the selected room style, the plurality of components, and the plurality of options are organized in a frame/slot hierarchy, and wherein the subset of the plurality of options is determined by an inference operation using the selected room style as a constraint in the frame/slot hierarchy; wherein the plurality of components are each represented in a first and second set of frames and the plurality of options are represented as slots of the first and second set of frames, respectively;

selecting a user-specified attribute for at least one of a plurality of room components, wherein selection of invalid attributes is prevented; and updating in the processor-based system a list of product data associated with the room design based on the change.

11. The method of claim 10 further comprising changing in the processor-based system a bill of materials associated with the room based on the user-supplied request to change.

12. A method of configuring a room, the method comprising:

receiving in a processor-based system input data at a user interface concerning the room configuration;

storing in a memory module data defining a plurality of attributes for a plurality of components associated with the room in a frame/slot hierarchy, wherein the plurality of components are each represented in a first and second set of frames and the plurality of attributes are represented as slots of the first and second set of frames, respectively;

selecting a user-specified attribute for at least one of a plurality of room components, wherein selection of invalid attributes is prevented, comprising:

performing in the processor-based system an attribute-based inference operation based on the input data received in said receiving step that identifies within the frame/slot hierarchy available attributes and invalid attributes for the at least one of the plurality of components, wherein the available attributes are identified based on a selected pre-configured consumer application and at least one of the plurality of components;

generating in the processor-based system a two-dimensional image of the room configuration, the room configuration containing a plurality of components inferred in said performing step, each of the inferred components representing at least one set of product data having attributes inferred during said performing step;

enabling modification within the processor-based system of at least a first one of the plurality of components, whereby wherein a first set of product data represented by the first component is replaced with a second set of product data different from the first set of product data;

generating a three-dimensional image of the room; and modifying in the processor-based system respective locations of said plurality of components in the room while viewing the three-dimensional image based on a user-supplied request to modify.

13. The method of claim 12 wherein the attribute-based inference operation infers the plurality of components from data organized in a frame/slot hierarchy.

* * * * *